(12) United States Patent
Olleta et al.

(10) Patent No.: US 7,587,647 B2
(45) Date of Patent: Sep. 8, 2009

(54) METHOD FOR TESTING ANALOG AND MIXED-SIGNAL CIRCUITS USING DYNAMIC ELEMENT MATCHING FOR SOURCE LINEARIZATION

(75) Inventors: Beatriz Olleta, Baltimore, MD (US); Hanjun Jiang, Ames, IA (US); Degang Chen, Ames, IA (US); Randall L. Geiger, Boone, IA (US)

(73) Assignee: Iowa State University Research Foundation, Inc., Ames, IA (US)

( * ) Notice: Subject to any disclaimer, the term of this patent is extended or adjusted under 35 U.S.C. 154(b) by 1115 days.

(21) Appl. No.: 10/909,105

(22) Filed: Jul. 30, 2004

(65) Prior Publication Data

US 2005/0057271 A1    Mar. 17, 2005

Related U.S. Application Data

(60) Provisional application No. 60/492,087, filed on Aug. 1, 2003.

(51) Int. Cl.
*G06F 11/00* (2006.01)

(52) U.S. Cl. .................. 714/740; 341/118; 341/120

(58) Field of Classification Search ............... 341/118, 341/120; *H02M 1/10; H03M 1/10*
See application file for complete search history.

(56) References Cited

U.S. PATENT DOCUMENTS

| | | | |
|---|---|---|---|
| 5,982,317 A * | 11/1999 | Steensgaard-Madsen | 341/143 |
| 6,563,444 B2 * | 5/2003 | Zhang et al. | 341/120 |
| 6,768,318 B2 * | 7/2004 | Burt et al. | 324/651 |
| 2002/0014982 A1 * | 2/2002 | Jonsson | 341/120 |
| 2002/0026469 A1 * | 2/2002 | Bugeja et al. | 708/805 |
| 2002/0084772 A1 * | 7/2002 | Ruha et al. | 320/162 |

OTHER PUBLICATIONS

Olleta, B et al.; A dynamic element matching approach to ADC testing; Circuits and Systems, 2002. MWSCAS-2002. The 2002 45th Midwest Symposium on vol. 2, Aug. 4-7, 2002 pp. II-549-II-552 vol. 2.*

* cited by examiner

*Primary Examiner*—Scott T Baderman
*Assistant Examiner*—Sam Rizk
(74) *Attorney, Agent, or Firm*—McKee, Voorhees & Sease, P.L.C.

(57) ABSTRACT

A method of testing an analog and/or mixed-signal circuit can be used in either a production or a built-in self test environment. The method includes generating an excitation signal for testing by using dynamic element matching for performance enhancement of the test signal generator that applies an excitation, and/or by measuring an output of the DUT using dynamic element matching for performance enhancement of an output measurement device. Signal generators and circuits using aspects of the method are also discussed.

29 Claims, 4 Drawing Sheets

METHOD FOR TESTING ANALOG AND MIXED-SIGNAL CIRCUITS USING DYNAMIC ELEMENT MATCHING FOR SOURCE LINEARIZATION

CROSS-REFERENCE TO RELATED APPLICATIONS

This application is a conversion of and claims priority to U.S. Provisional Application Ser. No. 60/492,087, filed Aug. 1, 2003, which is hereby incorporated by reference in its entirety.

GRANT REFERENCE

Work for this invention was funded in part by a grant from the National Science Foundation, Grant No. 0120345. The government may have certain rights in this invention.

BACKGROUND OF THE INVENTION

The present invention relates to the testing of analog and mixed-signal circuits. More particularly, although not exclusively, the present application relates to the testing of analog and/or mixed-signal circuits using Dynamic Element Matching for effective source linearization or effective precision waveform generation.

The use of mixed-signal circuits continues to grow. At the same time, the performance capabilities of these circuits are also increasing. This creates significant problems in testing. For example, when producing components having high performance, even the best commercial test equipment only has performance capabilities that are marginally capable of testing such state of the art parts. In addition, there are emerging integrated circuits that have performance capabilities that will exceed that of the best available commercial testers. Therefore, the use of commercial production testers can be problematic.

An alterative to using commercial production testers is to do testing in a built-in-self-test (BIST) environment. Self-testing or partial self-testing can reduce or eliminate production testing costs. However, in many cases the use of BIST is simply not practical because the testing circuitry may have greater complexity and/or area requirements than the device under test.

Most prior art analog and mixed-signal testing requires very precise excitations which are costly to generate whether they be in a production environment or a BIST environment. The time required to generate precision excitations in a production test environment may also be exceedingly long because, in part, of settling concerns but long settling time is in direct conflict with source stationarity concerns. The cost of production testing of some analog and mixed-signal circuits has become very high because of the expense associated with the production testers and because of the time many circuits require on these testers. In a BIST environment, the requirements for the excitations are so severe that there is little industrial adoption of existing techniques for mixed-signal functions.

Although seemingly unrelated to testing, at least to one not having the benefit of this disclosure, dynamic element matching (DEM) techniques have been around for some time in circuit design (as opposed to testing) of components such as data converters. DEM recognizes that element matching errors are inevitable due to inherent process variations. Although special layout techniques, special processes, and/or laser trimming can be used to reduce matching errors, these methods lead to significant cost increases. The DEM technique accepts matching errors as inevitable and dynamically rearranges the interconnections of the mismatched elements so that on the average the element values are nearly equal. If the mismatched components are rearranged properly, the errors caused by them can be reduced or eliminated.

Existing DEM structures are used in designing real-time circuits, including DEM analog-to-digital converters. However, DEM digital-to-analog-converters are plagued by time-local nonstationarity and require exceedingly long and random switching sequences to achieve adequate "average-performance" improvement. Thus, problems remain with the use of DEM structures.

What is needed is an improvement in the state of the art of testing. Therefore, it is a primary object, feature, or advantage of the present invention to improve upon the state of the art.

It is a further object, feature, or advantage of the present invention to provide a method of analog and/or mixed-signal circuit testing which can be used for either BIST or production environments.

A still further object, feature, or advantage of the present invention is to provide a method of analog and/or mixed-signal circuit testing that provides test signal generation that is fast.

A still further object, feature, or advantage of the present invention is to provide a method of analog and/or mixed-signal circuit testing that provides test signal generation that requires nominal design effort and nominal silicon area to implement.

A still further object, feature, or advantage of the present invention is to provide a method of analog and/or mixed-signal circuit testing that provides test signal generation that does not require calibration or testing.

Another object, feature, or advantage of the present invention is to provide a method of analog and/or mixed-signal circuit testing that is of reasonable cost.

Yet another object, feature, or advantage of the present invention is to use a DEM structure, not in the DUT, but in the signal generator thereby eliminating the real time concern when using DEM.

These and/or other objects, features, or advantages of the present invention become apparent from the specification that follows.

SUMMARY OF THE INVENTION

The present invention provides for Dynamic Element Matching for testing of discrete and integrated circuits and systems. According to one aspect, the invention provides a method of testing an analog and/or mixed-signal circuit. According to the method, an excitation signal is generated for testing using dynamic element matching. Then, the excitation signal is applied to the circuit under test. The present invention provides that the Dynamic Element Matching can be either deterministic or random. The present invention provides for built-in self-test or production environment testing. The method provides for testing of various characteristics including but not limited to integral nonlinearity (INL), differential nonlinearity (DNL), Spurious Free Dynamic Range (SFDR), and Total Harmonic Distortion (THD).

According to another aspect of the present invention, a signal generator for testing an analog or mixed-signal circuit is disclosed. The signal generator includes a plurality of matching-critical elements. There is switching control logic associated with the plurality of matching-critical elements for generating an excitation signal for testing using dynamic element matching. An output from the signal generator is electrically connected to a device under test for applying the excitation signal to the device under test.

According to another aspect of the present invention a circuit comprises a device under test and a signal generator electrically connected to the device under test. The signal generator includes a plurality of matching-critical elements, switching control logic associated with the plurality of matching-critical elements for generating an excitation signal for testing using dynamic element matching. There is an output measurement device electrically connected to the other device under test for measuring an output response of the device under test. A performance evaluation structure is operatively connected to the device under test for determining the performance of the device under test based on the output response. A feedback control loop is electrically connected to the device under test and the performance evaluation structure for providing performance feedback to the device under test.

According to yet another aspect of the present invention a method of testing an analog and/or mixed signal circuit is disclosed. The method includes generating an excitation signal for testing and applying the excitation signal to the circuit to provide an output. The output of the circuit is measured using dynamic element matching and the circuit is characterized at least partially based on the output.

DETAILED DESCRIPTION OF THE EXEMPLARY EMBODIMENTS

Figure 1:
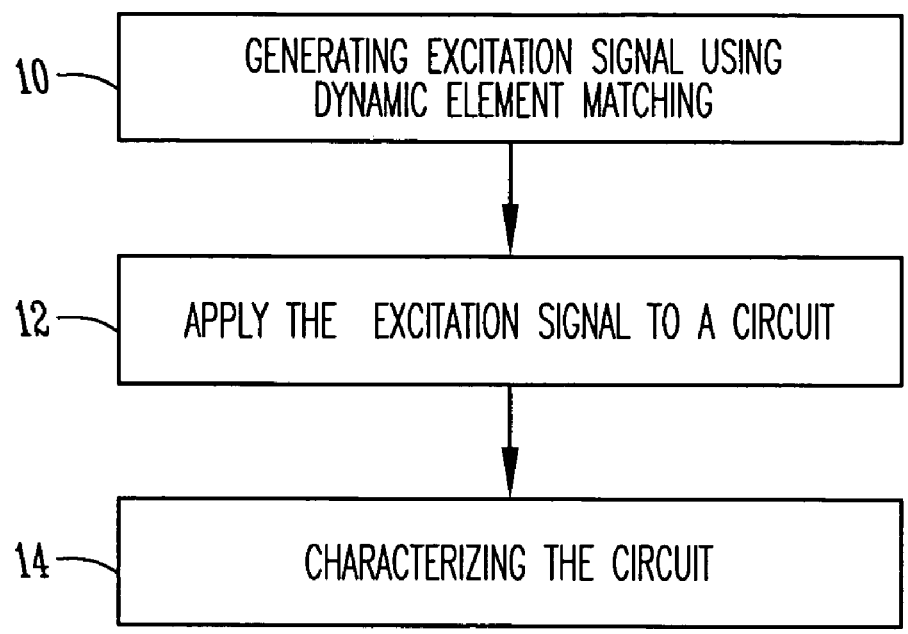
FIG. 1 provides an overview of one embodiment of the methodology of the present invention.

This invention provides for the use of Dynamic Element Matching (DEM) for testing of discrete and integrated circuits and systems. Although the concept of DEM is well known and has been reported for use in the design of both Digital to Analog Converters (DACs) and Analog to Digital Converters (ADCs), the use of DEM for the purpose of testing is new. Existing approaches to DEM that are used in the design of ADCs or DACs are generally plagued by time-local nonstationarity of the ADC or DAC.

In one embodiment of the DEM approach to testing of the present invention, a DAC using DEM is used to generate an excitation for testing the DNL and INL of an ADC. The DEM DAC is used to generate a highly "average linear" input signal and this "average linear" input signal is sufficient to use standard histogram-based algorithms to determine the INL and DNL of the ADC under test. In the present invention, the time-local nonstationarity of DEM does not affect the stationarity of the device-under-test (DUT) since it is used only in the signal generator for the DUT. Furthermore, the time-local nonstationarity of the signal source can be appropriately utilized to effectively increase the equivalent resolution of the signal generator. In the present embodiment, the concept of using Deterministic Dynamic Element Matching (DDEM) is also introduced. In contrast to most existing DEM approaches (that are more appropriately termed Random Dynamic Element Matching (RDEM)) which require highly random scrambling of the matching-critical components to obtain "statistically average linear" performance, the DDEM approach provides "deterministically average linear" performance. With the DDEM approach, the "average linearity" of the excitation can be very precise and, in particular, much more precise than what is achievable with the RDEM approach unless a very large number of samples are generated with the RDEM. In particular, if the number of samples used in the DDEM is equal to the number of match-critical elements, an appropriate DDEM switching strategy can provide precise "average linearity." In contrast, the RDEM achieves near precise average linearity only when the number of samples used approaches infinity. It is also possible for the DDEM approach to achieve adequate "average linearity" with a number of samples that is significantly smaller than what is needed for precise "average linearity." The implication of this improved average linearity of the DDEM approach in a testing environment is the need for a much smaller number of test input signals to obtain the same level of test performance that is achievable with using a RDEM excitation. Finally, the same histogram algorithms that are used for linearity testing of the ADC in existing production test environments can be used with DEM excitations and the number of inputs required for a given level of performance of a test will typically not be any larger than is required with existing testing approaches and may actually be less.

A person skilled in the art having the benefit of this disclosure will appreciate that in addition to the generation of an "average linear" input for testing INL and DNL of an ADC, one can use DEM (either RDEM or DDEM) for signal generation of other test signals (e.g. sine waves) to test other parametric performance specifications (e.g. THD, SFDR, and others) on other types of systems (e.g. filters, DACs, and others).

The use of DEM signal generators for testing can be applied in either a production test environment or a BIST environment. In a production test environment, the cost of a DEM signal generator may be much less than the cost of precision test equipment, the speed of the DEM signal generator can be very fast, and the performance potential can exceed that of the best available test equipment. In a BIST environment, the DEM signal generators and, in particular, the DDEM signal generators can be very small while still maintaining excellent performance. Furthermore, the required matching accuracy of elements in and the resolution of DDEM signal generators can be much less than what are correspondingly required for existing signal generators used in a production test environment. For example, the signal generator in a DAC used to test an ADC generally requires an accuracy level that is 3 or 4 bits more than the resolution of the DUT. In contrast, the RDEM and the DDEM DACs used for signal generators in the testing of ADCs will typically not require any more resolution than that of the DUT, the required resolution of the DEM DACs may actually be equal to or one or two bits less than that of the DUT, and the required matching accuracy of circuit elements in the DDEM DAC may be commensurate to those required of a conventional DAC that has accuracy that is several bits less than that of the DUT. Finally, at the high-end of the speed/resolution spectrum the DDEM approach offers potential for providing a test solution not possible with the best existing commercial test equipment.

FIG. 1 shows a basic flow diagram of an overview of one embodiment of the present invention. In step 10, an excitation signal is generated using dynamic element matching. In step 12, the excitation signal is applied to a circuit (or deviceunder-test) to provide an output. In step 14, the circuit is characterized or a test result is obtained, at least partially based on the output. Of course, numerous excitation signals can be generated and applied in order to arrive at a particular test result or characterization of the circuit.

Figure 2:
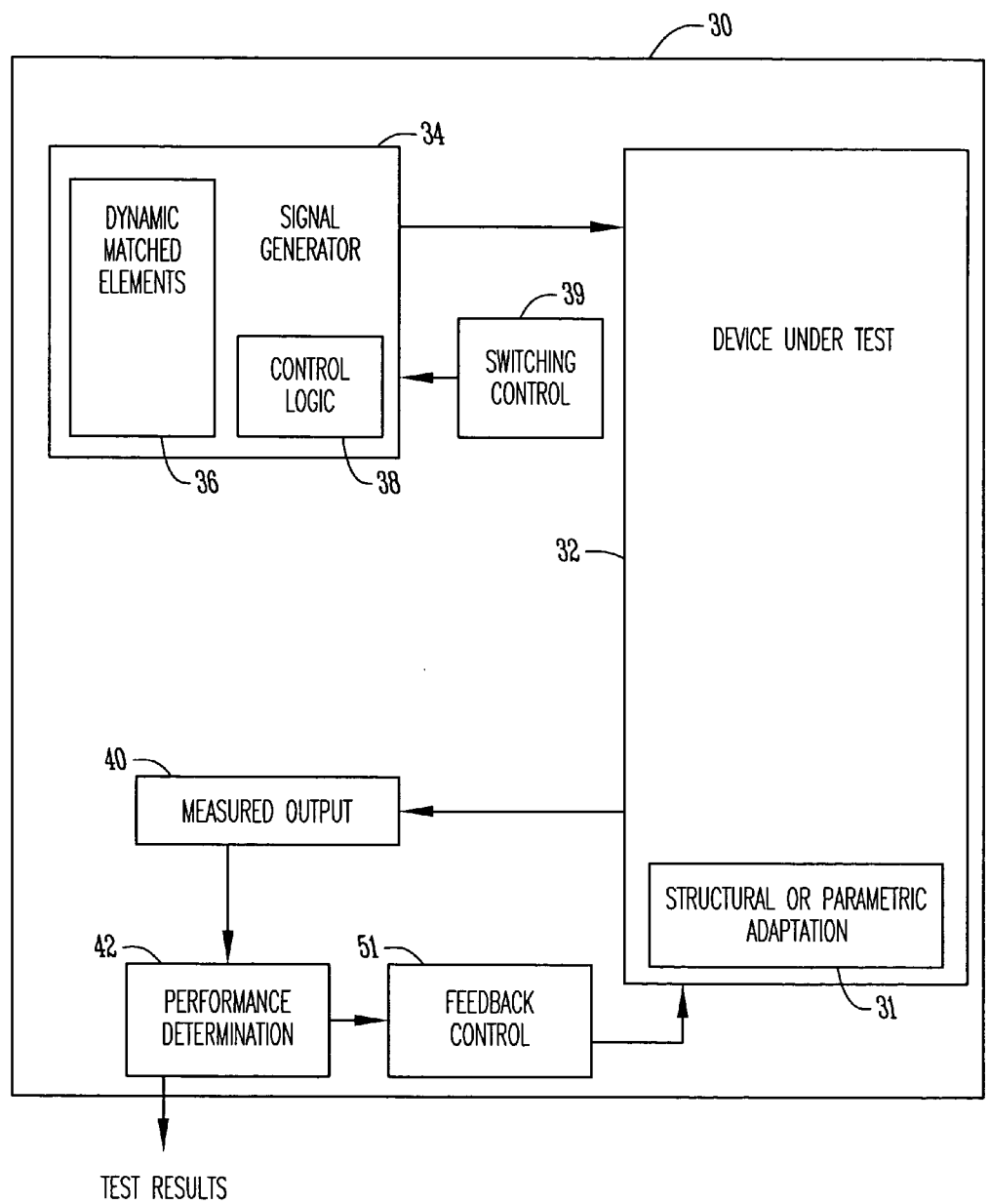
FIG. 2 provides a block diagram of one embodiment of an integrated circuit having BIST according to the present invention.

FIG. 2 provides one embodiment of a device 30 of the present invention with a built-in-self-test. A device-under-test portion 32 is shown. A signal generator 34 is operatively connected to the device under test 32. The signal generator 34 includes matching-critical elements 36 and a control logic circuit 38. The switching sequence and test control 39 generates the appropriate dynamic element matching switching signals to control the signal generator 34 to generate excitation signals for the device under test 32.

A circuit portion 40 is used to measure the output response of the DUT 32. The measured response is used by a digital signal processing circuit 42 to determine the performance of the DUT 32. An optional feedback control loop can be used based upon the determined circuit performance from 42 to provide feedback to the structural and/or parametric adaptation portion 31 of the device under test 32. The structural and/or parametric adaption portion can then adjust certain structure or parameters of the DUT so as to improve the performance of the DUT. Feedback control 51 can provide feedback control to the structural or parametric adaptation portion 31 from the performance determination portion 42. The determined circuit performance from 42 is also sent off the chip as self-test results. Although shown in a BIST embodiment, the signal generator 34 of the present invention can be separately used in a production environment.

The present invention contemplates that DEM can be used for testing of any number of circuits and is not limited to any particular type of analog and/or mixed-signal circuit. The present invention further contemplates variations in the type of dynamic element matching applied, type of circuit being tested, and whether the testing is in a BIST or production test environment. The invention contemplates variations in whether the dynamic element matching for testing is random or deterministic. The invention contemplates variations in switching sequences and control logic in either random or deterministic dynamic element matching for testing. The present invention contemplates a variation in the type of test signal used, the purpose of the test, and other variations. For example, in the context of data converters, the DEM technique can be applied to test or characterize INL, DNL, SFDR, and/or THD as well as other performance parameters in data converters.

The basic underpinnings of the present invention can be applied in numerous contexts and in a variety of ways. For example DDEM can be used in a signal source generator to generate signals with very precise average/expected waveforms, which may be done by specifically relating the number of samples per code to the architecture of the DDEM source. By using such a technique for relating the number of samples of the DDEM signal generator to the number of average samples per code for the DUT very precise average linear signals can be generated. The technique can be extended by relating the number of samples of the DDEM to the number of average samples per code of the DUT so that other very precise excitations can be generated such as sinusoidal waveforms or spectrally rich waveforms comprised of multiple sinusoidal waveforms of varying frequencies, amplitudes and phases.

Of course, once one appreciates the essence of the present invention, one skilled in the art will appreciate that the switching sequences of DDEM signal generators can be controlled to achieve desired distribution properties of the generated signals. Preferably the complexity of the switching control logic is reduced with minimal or no degradation in the performance of the DEM signal generators.

In implementing designs for providing the methodology of the present invention, the elements in the DEM source on a layout along with switching sequences can be placed so that "soft" cancellation of linear and/or higher-order gradients can be achieved. This includes "soft" common-centroid layouts and switching sequences.

Where analog and/or mixed-signal integrated circuits are built to include DEM signal generators (both DDEM and RDEM), such can be in scribe lanes for implementing BIST or Built In Wafer Self Test, in a portion of the die allocated for BIST circuitry, or distributed throughout the circuit as part of an integrated design for a BIST solution.

The present invention contemplates minimizing the cost (such as design and manufacture costs) of DDEM signal generators while maintaining a given level of accuracy in analog and mixed-signal testing.

The present invention also provides for new architectures for analog and mixed-signal functions that use a DEM signal generator to facilitate measuring performance on chip and a feedback loop that uses the measured performance to adapt (tune) the circuit to meet target specifications. The variation can offer improved performance, improved yield, reduced cost and reduced area over what is attainable with existing architectures.

A natural extension of the concept of using DEM for signal generation is to use DEM in the measurement device for testing. One application of using DEM measurement devices would be in the testing of DACs. A second natural extension would be in simultaneously using DEM signal generators and DEM measurement devices for configuring either a BIST or a production test environment. A depiction of the second extension appears in FIG. 3 and FIG. 4. In both extensions, the same benefits of a dramatic reduction in the matching-accuracy requirements for matching-critical components in the measurement device can be realized and in both extensions both random DEM or deterministic DEM techniques can be used.

Figure 3:
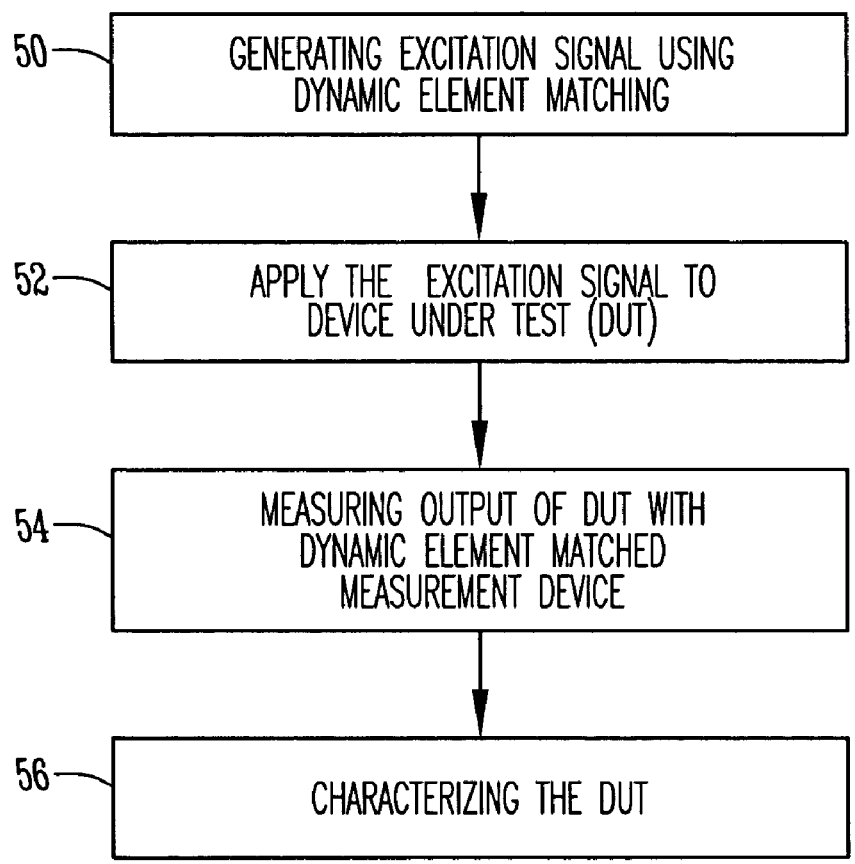
FIG. 3 provides an overview of one embodiment of the methodology of the present invention where DEM is used in the measurement device.

FIG. 3 shows a basic flow diagram of an overview of one embodiment of the present invention where dynamic element matching is used. In step 50, an excitation signal is generated using dynamic element matching. In step 52, the excitation signal is applied to a circuit (or device-under-test) to provide an output. In step 54, one or more outputs of the DUT are measured with a dynamic element matched measurement device. In step 56, the circuit is characterized or a test result is obtained, at least partially based on the output. Note that in the embodiment of FIG. 3, dynamic element matching is used both in the generation of the excitation signal (step 50) as well as in the measurement (step 54). Of course, numerous excitation signals can be generated and applied in order to arrive at a particular test result or characterization of the circuit. Similarly, the measurement device can implement dynamic element matching in various ways.

Figure 4:
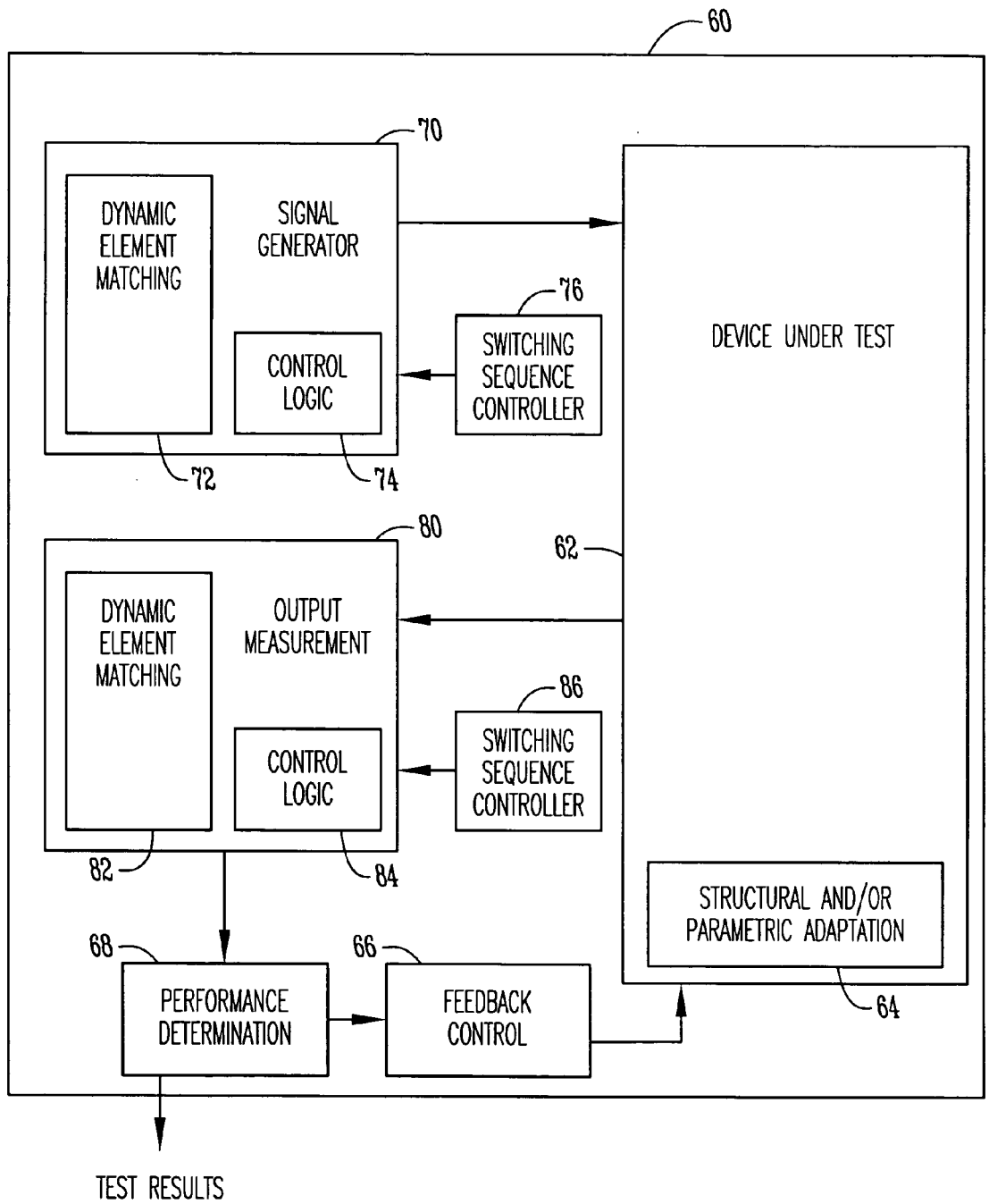
FIG. 4 provides a block diagram of another embodiment of the present invention where DEM is used in the measurement device.

FIG. 4 provides one embodiment of a device 60 of the present invention in a BIST or production environment. A device-under-test portion 62 is shown. The device-under test portion 62 includes a functional block for structural and/or parametric adaptation 64. A signal generator 70 is operatively connected to the device under test 62. The signal generator 70 includes matching-critical elements 72 and a control logic circuit 74. The switching sequence and test control 76 generates the appropriate dynamic element matching switching signals to control the signal generator 70 to generate excitation signals for the device under test 62.

A circuit portion 80 having a dynamic element matching component 82 and a control logic component 84 is used to measure the output response of the DUT 62. The measured response is used by a digital signal processing circuit 68 to determine the performance of the DUT 62. An optional feedback control loop 66 can be used based upon the determined circuit performance from 68 to provide feedback to the structural and/or parametric adaptation portion 64 of the device under test 62. A switching sequence controller 86 is shown. The structural and/or parametric adaption portion can then adjust certain structure or parameters of the DUT so as to improve the performance of the DUT. The determined circuit performance from the digital signal processing circuit 68 is also sent off the chip as self-test results. Although shown in a BIST embodiment, the signal generator 70 of the present invention can be separately used in a production environment.

Methods and devices providing for use of dynamic element matching in testing of analog and/or mixed signal circuits have been disclosed. The present invention contemplates numerous variations in the specific manner in which dynamic element matching is applied in the testing context and should not be limited to the specific structures and steps described herein.

What is claimed is:

1. A method of testing an analog and/or mixed-signal circuit comprising:
    generating an excitation signal for testing using dynamic element matching;
    applying the excitation signal to the circuit to provide an output;
    characterizing the circuit at least partially based on the output.

2. The method of claim 1 wherein the dynamic element matching is deterministic.

3. The method of claim 1 wherein the dynamic element matching is random.

4. The method of claim 1 wherein the characterizing is performed with built-in self-test (BIST).

5. The method of claim 1 wherein the characterizing is performed during production testing.

6. The method of claim 1 wherein the characterizing comprises testing for integral nonlinearity (INL).

7. The method of claim 1 wherein the characterizing comprises testing for differential nonlinearity (DNL).

8. The method of claim 1 wherein the characterizing comprises testing for Spurious Free Dynamic Range (SFDR).

9. The method of claim 1 wherein the characterizing comprises testing for Total Harmonic Distortion (THD).

10. The method of claim 1 wherein the circuit is a data converter.

11. The method of claim 1 wherein the step of generating is performed with a signal generator.

12. The method of claim 11 wherein a switching sequence for the dynamic element matching is selected to simplify the signal generator.

13. The method of claim 11 wherein a control logic for the dynamic element matching is selected to simplify the signal generator.

14. A signal generator for testing an analog or mixed-signal circuit, comprising:
    a plurality of matching-critical elements;
    switching control logic associated with the plurality of matching-critical elements for generating an excitation signal for testing using dynamic element matching;
    an output from the signal generator to a device under test for applying the excitation signal to the device under test.

15. The signal generator of claim 14 wherein the device under test provides an output for use by a performance evaluation structure.

16. The signal generator of claim 14 wherein the dynamic element matching is deterministic.

17. The signal generator of claim 14 wherein the dynamic element matching is random.

18. A method of testing an analog and/or mixed-signal circuit comprising:
    generating an excitation signal for testing;
    applying the excitation signal to the circuit;
    measuring an output of the circuit using dynamic element matching; and
    characterizing the circuit at least partially based on the output.

19. The method of claim 18 wherein the dynamic element matching is deterministic.

20. The method of claim 18 wherein the dynamic element matching is random.

21. The method of claim 18 wherein the testing is built-in self-test (BIST).

22. The method of claim 18 wherein the testing is production testing.

23. The method of claim 18 wherein the step of generating an excitation signal for testing is performed using dynamic element matching.

24. The method of claim 18 wherein the circuit is a data converter.

25. A circuit comprising:
    a device under test; a signal generator comprising (a) a plurality of matching-critical elements, (b) switching control logic associated with the plurality of matching-critical elements for generating an excitation signal for testing using dynamic element matching; an output measurement device for determining a measured response of the device under test;
    a performance evaluation structure operatively connected to the device under test for determining the performance of the device under test based on the measured response; and
    a feedback control loop operatively connected to the device under test and the performance evaluation structure for providing performance feedback to the device under test.

26. The circuit of claim 25 wherein the device under test is a data converter.

27. The circuit of claim 25 wherein the dynamic element matching is deterministic.

28. The circuit of claim 25 wherein the dynamic element matching is random.

29. The circuit of claim 25 wherein the output measurement device comprises a plurality of matching critical elements.

\* \* \* \* \*

UNITED STATES PATENT AND TRADEMARK OFFICE
CERTIFICATE OF CORRECTION

PATENT NO. : 7,587,647 B2
APPLICATION NO. : 10/909105
DATED : September 8, 2009
INVENTOR(S) : Olleta et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1237 days.

Signed and Sealed this

Twenty-first Day of September, 2010

David J. Kappos
*Director of the United States Patent and Trademark Office*